United States Patent
Sareen

(10) Patent No.: US 8,536,951 B2
(45) Date of Patent: Sep. 17, 2013

(54) BUFFER FOR TEMPERATURE COMPENSATED CRYSTAL OSCILLATOR SIGNALS

(75) Inventor: Puneet Sareen, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 308 days.

(21) Appl. No.: 13/039,050

(22) Filed: Mar. 2, 2011

(65) Prior Publication Data
US 2011/0227555 A1  Sep. 22, 2011

(30) Foreign Application Priority Data
Mar. 17, 2010  (DE) .......................... 10 2010 011 757

(51) Int. Cl.
*H03B 5/36* (2006.01)
*H03L 1/02* (2006.01)

(52) U.S. Cl.
USPC ......... 331/74; 331/116 FE; 331/158; 331/176

(58) Field of Classification Search
USPC ..................... 310/326; 326/26–28; 327/299; 331/74, 116 FE, 116 M, 116 R, 154, 158, 331/176
See application file for complete search history.

(56) References Cited

U.S. PATENT DOCUMENTS

| | | | | |
|---|---|---|---|---|
| 5,796,313 A | * | 8/1998 | Eitan ................................ | 331/57 |
| 6,320,473 B1 | * | 11/2001 | Leuschner ............... | 331/116 FE |
| 6,703,890 B2 | * | 3/2004 | Fukui ............................. | 327/534 |
| 7,348,859 B2 | * | 3/2008 | Yamamoto ...................... | 331/61 |
| 7,557,428 B2 | | 7/2009 | Kunitomo et al. | |
| 7,579,917 B2 | * | 8/2009 | Sakai et al. ..................... | 331/74 |
| 7,688,154 B1 | * | 3/2010 | Fotouhi ......................... | 331/158 |
| 7,812,682 B2 | * | 10/2010 | Boroditsky et al. ........... | 331/160 |
| 8,044,731 B2 | * | 10/2011 | Arai ....................... | 331/116 FE |
| 8,294,527 B2 | * | 10/2012 | Arai ....................... | 331/117 FE |
| 2006/0244546 A1 | * | 11/2006 | Yamamoto ..................... | 331/158 |
| 2008/0297268 A1 | | 12/2008 | Matsui et al. | |
| 2010/0013563 A1 | | 1/2010 | Kim et al. | |

OTHER PUBLICATIONS

ISB 3-540-42849-6 Springer Berlin Heidelberg, New York (Tietze, et al.), 1991.
ISBN 3-519-00149-7, "Silizium Halbleitertechnologie," B.G. Teubner Stuttgart, 1996 (Hilleringmann, et al.).
DE Search Report dated Jan. 21, 2011.

* cited by examiner

*Primary Examiner* — Levi Gannon
(74) *Attorney, Agent, or Firm* — Alan A. R. Cooper; W. James Brady III; Frederick J. Telecky, Jr.

(57) ABSTRACT

A buffer is provided. The buffer includes a buffering stage that receives an enable signal and an input signal and that provides an output signal and a bandgap stage that is coupled to the buffering stage and that is activated and deactivated by the enable signal. In particular, the buffering stage includes a buffering substage that includes a buffering transistor that is coupled to the input stage, wherein the buffering transistor is formed on a substrate, and wherein the buffering transistor has a channel with a doping concentration that is approximately the same as the substrate.

15 Claims, 4 Drawing Sheets

BUFFER FOR TEMPERATURE COMPENSATED CRYSTAL OSCILLATOR SIGNALS

CROSS-REFERENCE TO RELATED APPLICATIONS

This application is claims priority from German Patent Application No. 10 2010 011 757.9, filed Mar. 17, 2010, which is hereby incorporated by reference for all purposes.

TECHNICAL FIELD

The invention relates to an electronic device for buffering a signal of a temperature compensated crystal oscillator and a method for manufacturing such a device.

BACKGROUND

Along with the increasing popularity of handheld devices such as smart phones, PDAs and UMPCs etc. more and more functionality is to be integrated into a single portable device. A typical example of such a device is a mobile phone (also referred to as smart phones or media phones) which incorporate functions like Global Positioning System (GPS), wireless local area networks (WLAN), and Bluetooth. Typically, each of these features uses high performance stable clock signals. These clock signals are typically generated by temperature compensated crystal oscillators or TCXO, and for each feature there is usually a separate TCXO. As an example, such a system 100 can be seen in FIG. 1, where TXCOs 102-1 to 102-4 are provided for WLAN circuitry 104, GSP circuitry 106, Bluetooth circuitry 108, and other media circuitry 110. These crystal oscillators (i.e., 102-1 to 102-4) are generally more expensive than normal crystal oscillators due to their high stability and precision. However, due to competition in the market, there is a very high pressure to build the electronic devices at a very low price. Despite the desire to simplify systems (i.e., 100) in order to lower the costs, a typical portable device uses a separate TCXO for each feature because of difficulty in buffering TCXO output signals due to their small voltage swing and high frequency. Therefore, there is a general need for buffering the TCXO output signals.

SUMMARY

It is an object of the invention to provide an electronic device for buffering temperature compensated crystal oscillator signals, which is configured to provide a limited damping, an acceptable fan-out and the capability to process signals with a limited voltage swing.

According to an aspect of the invention, an integrated semiconductor electronic device with a substrate having a first doping concentration is provided. The first doping concentration is a light doping, which means the concentration is for example about $10^8/cm^2$ or between $10^7/cm^2$ and $10^9/cm^2$. There is a first MOS transistor configured to receive an output signal of a temperature compensated crystal oscillator (TCXO) at a control gate for providing the buffered TCXO signal at an output node. The output node may be the source of the first MOS transistor. This means that the first MOS transistor is configured to buffer the TCXO output signal. There is a second MOS transistor, which is built in a well having a second doping concentration. The well is built in the substrate with the first doping concentration. The second MOS transistor will then be coupled to supply a current to the first MOS transistor. The channel of the first MOS transistor is directly built in the substrate. The first doping concentration may be by at least a factor of ten lower than the second doping concentration. The second doping concentration may be about $10^{14}/cm^2$. The electronic device according to this aspect of the invention uses a specific MOS transistor (the first MOS transistor) in order to buffer the TCXO output signals. This MOS transistor is built in the lightly doped substrate without using a separate well. Due to these technological measures, it is possible to buffer signals, as for example the TCXO output signals having a low voltage swing and providing very limited damping and additive noise to the signals.

According to an aspect of the invention, the channel of the first MOS transistor may have the same type of doping and the same doping concentration as the substrate. This aspect of the invention provides that the first MOS transistor has a lower noise characteristic than the second MOS transistor.

According to still another aspect of the invention, the first MOS transistor comprises a plurality of parallel branches. Each of the branches contains a partial MOS transistor. All the partial MOS transistors form together the first MOS transistor. The gates of the partial MOS transistors are coupled together to receive the output signal of the TCXO. There is further a plurality of resistors. There is one resistor coupled to each source of a partial MOS transistor. The other side of the resistors is coupled to the output node. This provides that the output resistance of the first MOS transistor is substantially reduced. Furthermore, also the noise characteristic of the first MOS transistor is reduced.

There may also be a third MOS transistor. The third MOS transistor may be coupled to the first MOS transistor and it may be configured similarly to the first MOS transistor. This means that the third MOS transistor may also be built directly in the substrate and a channel may not be doped differently from the substrate. In other words, the third MOS transistor may have a channel with the same doping and the same doping type and the same doping concentration as the substrate.

The electronic device according to the invention can be used to buffer signals from temperature compensated crystal oscillators (TCXOs). Therefore, electronic devices using this kind of buffer can substantially reduce the number of separate temperature compensated crystal oscillators. This reduces the overall costs of the respective devices and complexity.

The invention also provides a method of manufacturing an integrated semiconductor electronic device. A first MOSFET transistor is built in a substrate having a first doping concentration. A channel of the first MOS transistor is built, wherein the channel has the same type of doping and the same doping concentration as the substrate. Furthermore, a well is formed in the substrate. The well has a second doping concentration. A second MOS transistor is then built in the well. The first MOS transistor is coupled with the second MOS transistor. The gate of the first MOS transistor is then coupled to receive the output signal of a temperature compensated crystal oscillator (TCXO).

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF EMBODIMENTS

Figure 2:
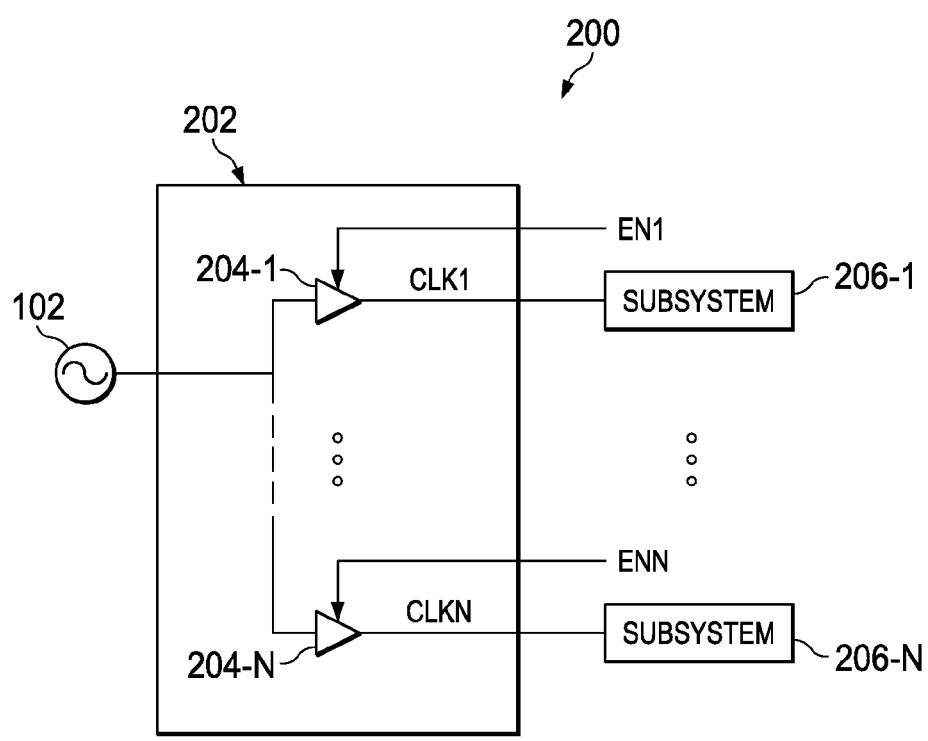
FIG. 2 shows an example of a system in accordance with a preferred embodiment of the present invention.

In FIG. 2, a system 100 in accordance with a preferred embodiment of the present invention can be seen. The system 100 generally comprises a TXCO 102, a clock distributor 202 (which generally includes clock buffers 204-1 to 204-N), and subsystems 206-1 to 206-N. These subsystems 206-1 to 206-N can generally correspond to features (i.e., Bluetooth subsystems) that use precision clock signals CLK1 to CLKN, which can be provided when buffers 204-1 to 204-N are enabled by enable signals EN1 o ENN.

Figure 1:
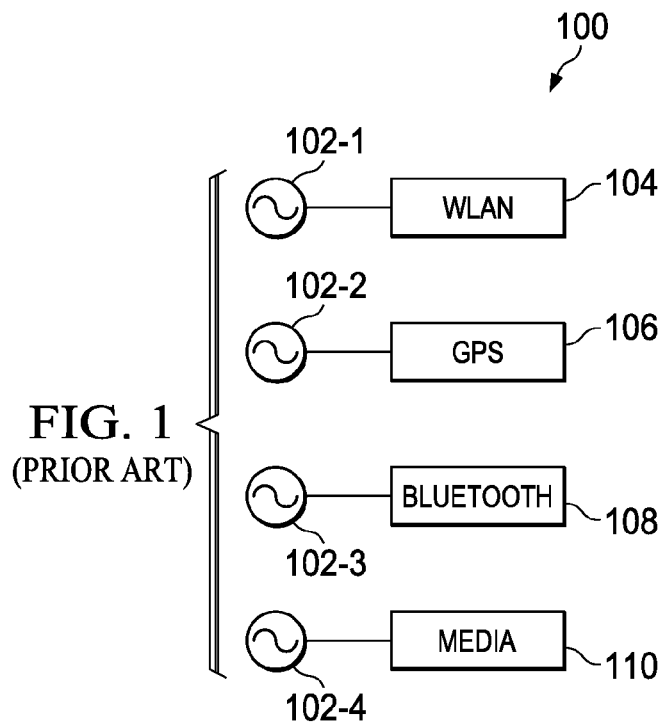
FIG. 1 shows an example of a conventional system employing several TCXOs.
Figure 3:
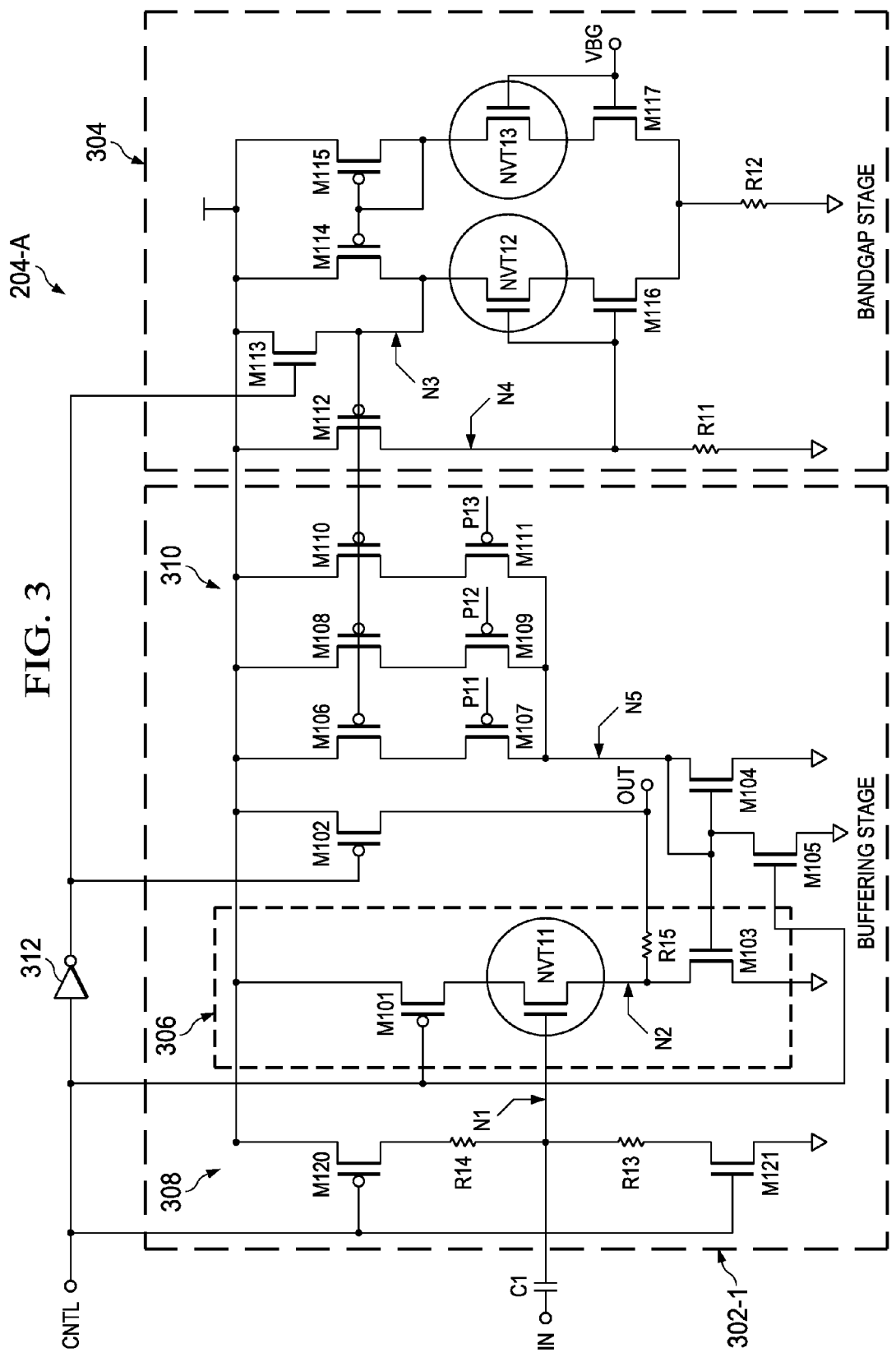
FIG. 3 shows an example of the clock buffer of FIG. 2.

Turning now to FIG. 3, the clock buffers 204-1 to 204-N (hereinafter 204-A for FIG. 3) can be seen in greater detail. The clock buffer 204-A generally comprises a buffering stage 302-1 and a bandgap stage 304. At pin IN a signal from a TCXO (i.e., TXCO 102 of FIG. 1) is received. This signal passed through a decoupling or AC coupling capacitor C1 that may be implemented externally to the integrated circuit or IC. At pin CNTL an enable signal (i.e., EN1) is receives so as to enable or disable the buffer 204-A.

Looking first to the buffering stage 302-1, there is an input circuit 308, a buffering substage 306-1, and a current control circuit 310. The input circuit 308 generally comprises a divider (i.e., resistors R14 and R15) and transistors M120 and M121. The resistive divider R13 and R14 is fed the input signal (from pin IN) at node N1 after having passing through the decoupling capacitor C1 serve as a biasing circuit for the incoming sine wave signal (i.e., from the TCXO 102). Transistors M120 and M121, which receive the enable signal (i.e., EN1), are used to enable or disable the input path or input circuit 308. Node N1 is coupled to the gate of transistor NVT11 (of subsystem 306-1). Transistor NVT11 generally functions as the main buffering transistor, which generally means that transistor NVT11 is directly built in the substrate of the IC containing buffer 204-A. In particular, transistor NVT11 does not receive any additional channel doping; the doping concentration of the channel for transistor NVT11 may be the same as the doping concentration of the substrate. For example, the channel of transistor NVT11 may have a doping concentration of $10^8/cm^2$, and the substrate may then also have a the same doping concentration. Also the doping type of the substrate and the channel of transistor NVT11 may be the same. Therefore, the threshold voltage of transistor NVT11 is very low and may even be negative. The lack of channel doping renders the transistor NVT11 less noisy than normal MOS transistors using channel doping or specific separate wells. The doping concentration of a channel of other transistors built in a well (transistors referenced with an M at the beginning) may be about $10^{14}/cm^2$. The doping level of the channel of a buffer transistor NVT11 may be at least a factor 10, 100 or 1000 lower than the normal doping level of NMOS or PMOS transistors. Advantageously, the doping level of the channel of a buffer transistor NVT11 may be at least a factor 10,000 or even 100,000 or more (also a factor $10^6$) lower than the normal doping level of NMOS or PMOS transistors. MOS transistor M101, transistor NVT11, and NMOS transistor M103 are coupled in series in substage 306-1. Resistor R15 is coupled to common node N2 (between transistors NVT11 and M103). The other terminal of resistor R15 is coupled to the drain of PMOS transistor M102 at output pin OUT. The source of PMOS transistor M102 is coupled to receive the supply voltage. Node N5 is the buffered sine wave output of the buffered TCXO signal.

The gate of NMOS transistor M103 is coupled to the gate of NMOS transistor M104 which is also coupled to the drain of transistor M104. NMOS transistor M103 and M104 form a current mirror. PMOS transistor M106 and PMOS transistor M107 are coupled in series. Furthermore, PMOS transistors M108 and M109 as well as transistors M110 and M111 are coupled in series. The drains of PMOS transistor M107, M109, and M111 are coupled together and also coupled to the drain of NMOS transistor M105. The gates of PMOS transistors M106, M108, and M110 are also coupled together. The input for control stage 304 is signal VBG which is received from a bandgap voltage generator. Therefore, signal VBG is the bandgap output voltage. NMOS transistors M116 and M117 generally have the same dimensions. These NMOS transistors M116 and M117 are coupled in series with MOS transistors NVT12 and NVT13 (which are similar in construction to transistor NVT11). The gates of NMOS transistor M116 and transistor NVT12 are coupled together, and the gates of NMOS transistor M117 and MOS transistor NVT13 are coupled together. The drains of NMOS transistors NVT12 and NVT 13 are coupled to the drains of NMOS transistors M114 and M115, respectively. PMOS transistors M114 and M115 are also in a current mirror configuration. A resistor R12 is coupled to the interconnection of the NMOS transistor M114 and M117. The common gate of NMOS transistor M116 and NMOS transistor NVT12 is coupled to a resistor R11. It is also coupled to the drain of PMOS transistor M112. The gate of PMOS transistor M112 is coupled to the common terminal of transistor M114 and transistor NVT12 (at node N3). Node N3 is also coupled to PMOS transistor M113. The source of PMOS transistor M113 is coupled to the supply voltage and the gate of PMOS transistor M113 is coupled to the output of inverter 312. As an example, the following transistors of stage 304 may have the about same dimensions: M114 and M115, NVT12 and NVT13, M116 and M117. This means that these transistors are generally dimensioned to match.

Figure 4:
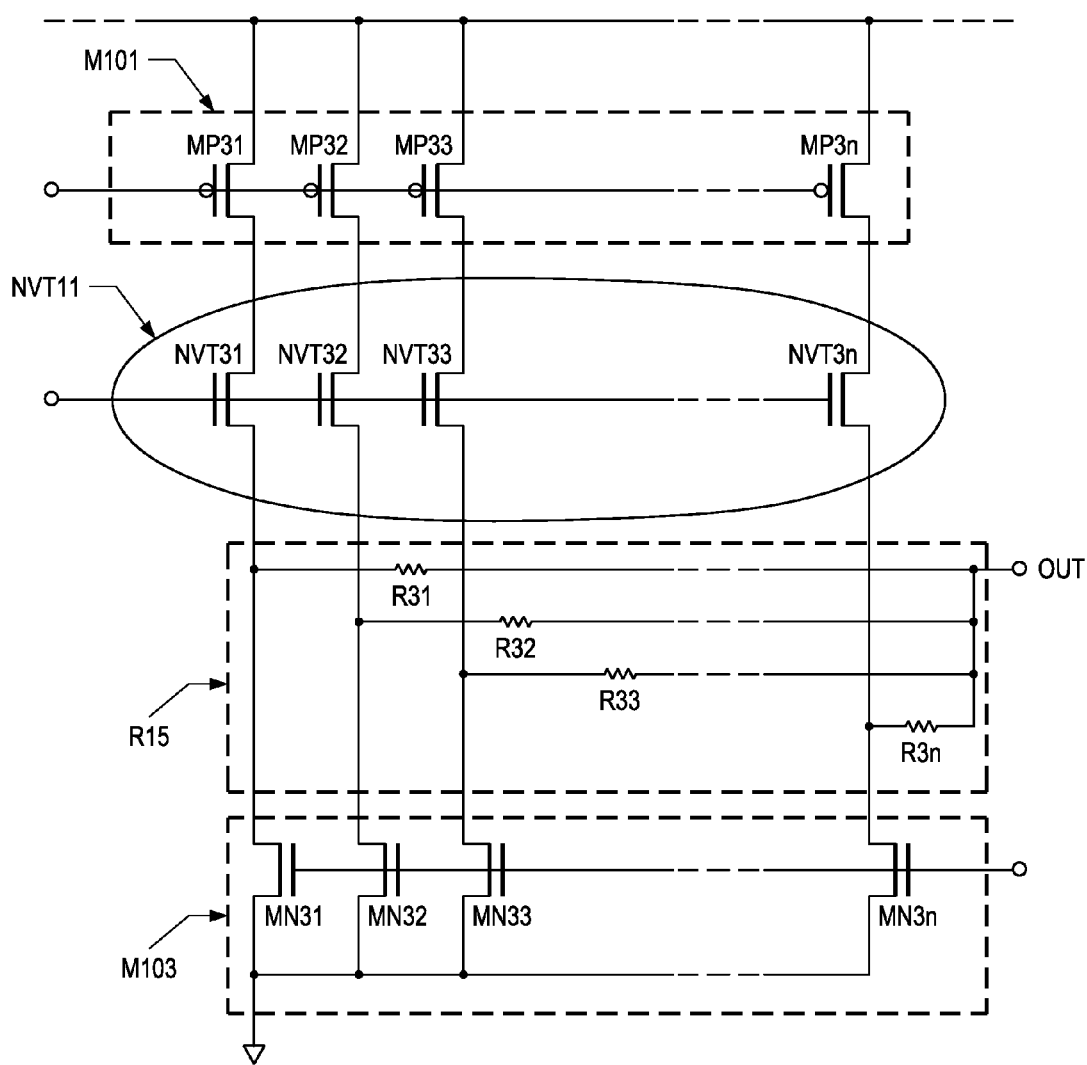
FIG. 4 shows an example of an alternative stage for the clock buffer of FIG. 3.

Turning to FIG. 4, another example of buffering substage 306-2 can be seen. In this example, PMOS transistors MP31 to MP3n, transistors NVT31 to NVT3n, resistors R31 to R3n, and NMOS transistors MN31 to MN3n respectfully correspond to PMOS transistors M101, transistor NVT11, resistor R15, and NMOS transistor M103 of FIG. 3. As shown, there are multiple branches that are coupled generally in parallel with one another.

Turning back to FIG. 3, control stage 304 implements a differential amplifier with one input at the common gate connection of transistor NVT13 and NMOS transistor M117 and the second input being the common gate connection of NVT12 and transistor M116. The single ended output of the differential amplifier is available at node N3. The output node N3 is further coupled to the gate of PMOS transistor M112 in order to provide the final output at node N4. The output from a band gap voltage or signal VBG is provided to the gate of transistor M117. Since node N4 is coupled to the common gate connection of transistor M116 and transistor NVT12, the voltage level at node N4 will be equal to the voltage level provided by the band gap voltage VBG. The value of resistor R11 serves to define the appropriate current through PMOS transistor M112. A current through PMOS transistor M112 is stable and changes by a change of the resistance value of resistor R11 or the band gap voltage VBG, which is inherently very stable. The current through PMOS transistor M12 is mirrored to PMOS transistors M106, M108, and M110. There may also be more mirroring branches than shown in current control circuit 310 (i.e., more than three branches). The current through transistors M106, M108, and M110 is equally passed through transistors M107, M109 and M111 respectively. Transistors M107, M109, and M111 operate as switches. The respective other sides of PMOS transistors M107, M109, and M111 are coupled together at node N5. This provides that the currents through each of the branches (i.e. transistors M107, M109, and M111) are summed up at node N5. The currents through transistors M107, M109, and M111 may be in a binary ratio also with respect to the current through transistor M112. This is useful in order to implement current programming options depending on the number and dimensions of the branches used. The proper ratio in width of the PMOS transistors M106, M108, and M110 can be used in order to achieve any desired relationship of the currents. Each of the branches is enabled or disabled by switching the respective PMOS transistor M107, M109, or M111 to receive the summed current at node N5. The summed current at node N5 is passed through NMOS transistor 104, which is coupled in a current mirror configuration to NMOS transistor M103. The current through NMOS transistor M104 further defines the current through NMOS transistor M103. Two NMOS transistors M103 and M104 are also dimensioned with respect to each other to multiply the current through M103 with respect to M104 by dimensioning the width of M103 with respect to the width of M104 appropriately. The length of M103 and M104 may then be the same. Signals P11, P12 and P13 may then serve to program the respective current with regard to the load driving capability of the buffer 204-A.

The current through PMOS transistor M101, transistor NVT11 and NMOS transistor M103 is defined by the current through NMOS transistor M104. This current is basically constant. The drain current of a MOS transistor is generally defined as $$ID = \frac{\mu nCox}{2} \cdot \frac{W}{L} \cdot (VGS - VT)^2 \quad (1)$$

The well-known equation (1) can be written as $$I_D = K(V_{GS} - VT)^2 \quad (2)$$

where K is constant for a fixed width to length ratio W/L. It may then further be derived to be:

$$V_{GS} - V_T = SQRT\left(\frac{I_D}{K}\right); V_G - V_S - V_T = SQRT\left(\frac{I_D}{K}\right) \quad (3)$$

which provides that $$V_S = V_G - V_1 - SQRT\left(\frac{I_D}{K}\right) \quad (4)$$

Finally yielding:

$$V_S = V_G - K1 \quad (5)$$

where K1 is a constant.

The voltage VS is the voltage at the source of transistor NVT11, which is the buffered output signal of the temperature compensated crystal oscillator TCXO (the voltage at node 126). The voltage at node N2 (voltage at the source of transistor NVT11) basically follows the voltage at the gate of transistor NVT11 (node N1), but the DC level is shifted down. The downshift of the DC level with respect to the gate depends on the threshold voltage of the transistor NVT11 and the current (drain current) through transistor NVT11. Transistor NVT11 should be operated in saturation. Transistor NVT11 and PMOS transistor M101 have to be dimensioned to supply the current to the load and the reference current.

As an example, the supply voltage level may be 1.8 V. The voltage swing of the output signal of the TCXO i.e., TXCO 102 of FIG. 1) may be 1.2 V. This means that the buffer 204-A should be able to buffer an input signal of 1.2 V peak to peak. Due to the DC shift of transistor NVT11, the supply voltage level can be a limiting factor if the gate source voltage to support a drain current through transistor NVT11 is too large. The gate-source voltage may be reduced by increasing the dimensions (i.e., channel width) of transistor NVT11. However, if the width of transistor NVT11 is increased, the area of the transistor will increase and thereby the input capacitance may become too large. This may entail that the crystal oscillator TCXO is not able to drive the buffer 204-A. The transistor NVT11 having a channel with same doping type and same doping concentration as the substrate according to aspects of the invention has a very low threshold voltage which might be zero or even negative. This generally avoids any need to increase the size of transistor NVT11 so as to reduce the gate source voltage to an acceptable level. The channel of transistor NVT11 may have a doping concentration of $10^8/cm^2$. The substrate may then also have a doping concentration of $10^8/cm^2$.

If the configuration shown in FIG. 4 is used, the effective resistance of resistor R15 can be reduced and may not affect the overall performance of the buffer 204-A. However, a certain resistance R15 can be used if the output pin OUT of the sine wave buffer 204-A is coupled to a bond pad. This is due to electrostatic discharge implications. If the enable signal at pin CNTL is zero or logic low, the current through buffering subsection 306 can flow and the buffer operation is turned on. Furthermore, the path including resistors R14 and R13 is also enabled. Furthermore, bandgap stage 304 is enabled. If a signal at pin CNTL is changed from logic low to logic high, the branch including resistors R13 and R14 is disabled, buffering subsection 306 is disabled and the output pin OUT is pulled high.

Figure 5:
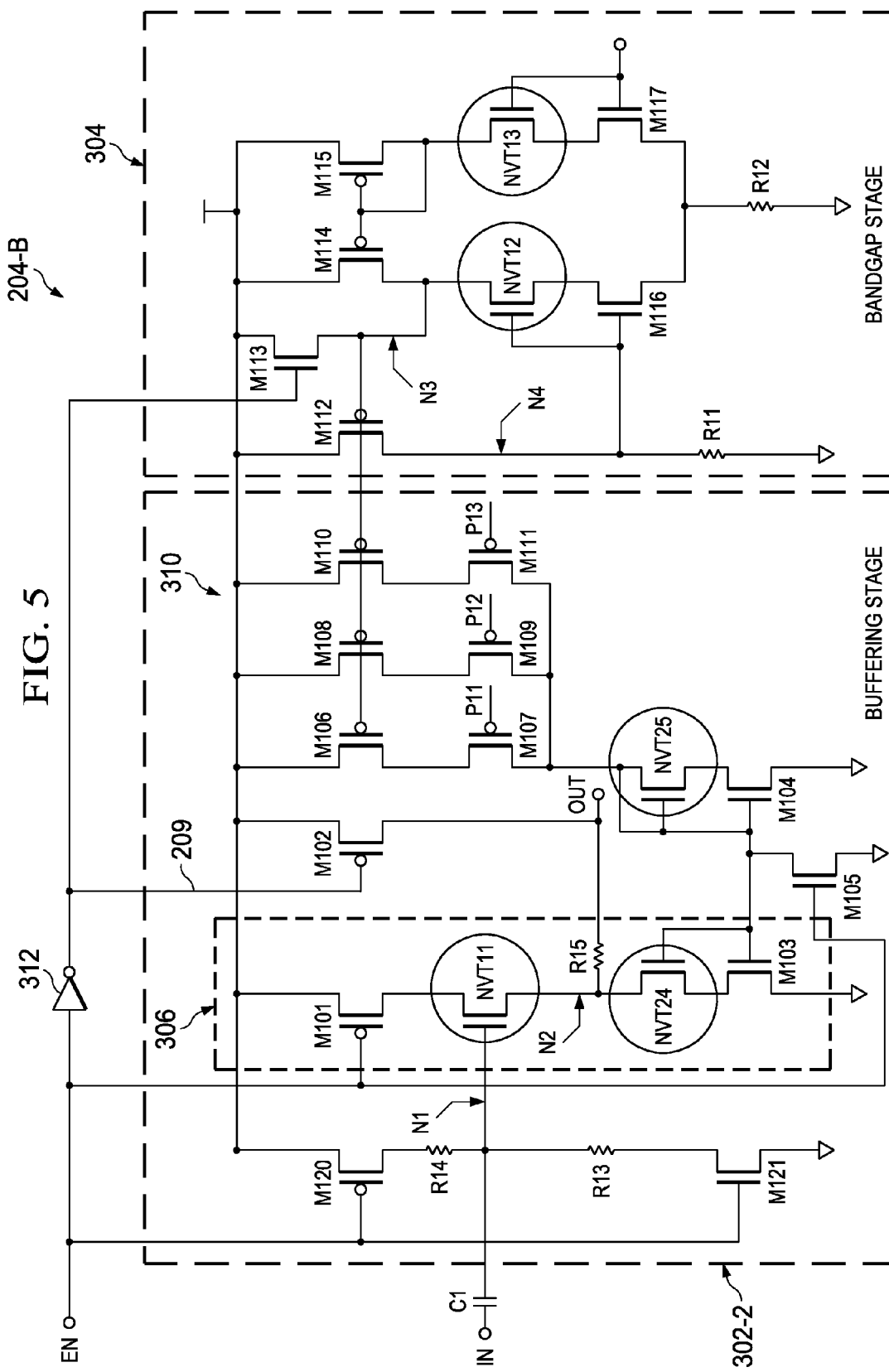
FIG. 5 an example of an alternative clock buffer of FIG. 2.

Turning to FIG. 5, another example of a buffer 204-B can be seen. Buffer 204-A is similar in construction to buffer 204-B, but, for buffer 204-B, there transistors NVT24 and NVT25 are cascoded with current mirror (which includes transistors M103 and M104). Transistor NVT24 and NVT25 are similar in construction to transistor NVT11. Using the cascoded transistors NVT24 and NVT25 improves the linearity of buffering of transistor NVT11 and reduces the distortion introduced by the buffer 204-B.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An apparatus comprising:
   a buffering stage that receives an enable signal and an input signal and that provides an output signal, wherein the buffering stage includes:
   an input stage that is activated and deactivated by the enable signal;
   a buffering substage that includes a buffering transistor that is coupled to the input stage, wherein the buffering transistor is formed on a substrate, and wherein the buffering transistor has a channel with a doping concentration that is approximately the same as the substrate; and a current control circuit that is coupled to the buffering substage; and a bandgap stage that is coupled to the current control circuit and that is activated and deactivated by the enable signal, wherein the buffering transistor further comprises a plurality of NMOS buffering transistors, and wherein the buffering substage further comprises a plurality of branches that are in parallel with one another, and wherein each branch includes at least one of the plurality of NMOS buffering transistors, and wherein each branch includes:

a PMOS transistor that receives the enable signal at its gate and that is coupled to the drain of its NMOS buffering transistor at its drain;

a resistor that is coupled to the source of its NMOS buffering transistor; and an NMOS transistor that is coupled to the source of its NMOS buffering transistor at its drain.

2. The apparatus of claim 1, wherein the buffering transistor is an NMOS buffering transistor, and wherein the buffering substage further comprises:

a PMOS transistor that receives the enable signal at its gate and that is coupled to the drain of the NMOS buffering transistor at its drain;

a resistor that is coupled to the source of the NMOS buffering transistor; and an NMOS transistor that is coupled to the source of the NMOS buffering transistor at its drain.

3. The apparatus of claim 2, wherein the PMOS transistor further comprises a first PMOS transistor, and wherein the resistor further comprises a first resistor, and wherein the bandgap stage further comprises:

a differential amplifier having a first input terminal, a second input terminal, and an output terminal, wherein the first input terminal receives a bandgap voltage;

a second PMOS transistor that is coupled to the output terminal of the differential amplifier at its gate and the second input terminal of the differential amplifier at its drain; and a second resistor that is coupled to the drain of the second PMOS transistor.

4. The apparatus of claim 3, wherein the NMOS transistor further comprises a first NMOS transistor, and wherein the current control circuit further comprises:

a plurality of current control branches that are coupled in parallel to one another, wherein each current control branch includes:

a third PMOS transistor that is coupled to the output terminal of the differential amplifier at its gate; and a fourth PMOS transistor that is coupled to the drain of the third PMOS transistor at its source; and a second NMOS transistor that is coupled to the drain of the fourth PMOS transistor of each current control branch at its drain and gate and that is coupled to the gate of the first NMOS transistor at its gate.

5. The apparatus of claim 4, wherein the channel further comprises a first channel wherein the buffering substage further comprises a third NMOS transistor that is coupled between the NMOS buffering transistor and the first NMOS transistor, and wherein the current control circuit further comprises a fourth NMOS transistor that is coupled between the plurality of current control branches and the second NMOS transistor, and wherein the third and fourth NMOS transistors each have a second channel having the doping concentration that is approximately the same as the substrate.

6. The apparatus of claim 5, wherein the differential amplifier further comprises:

a differential input pair; and a current mirror that is coupled to the differential input pair.

7. The apparatus of claim 6, wherein the differential amplifier further comprises a pair of fifth NMOS transistors coupled between the differential input pair and the current mirror, and wherein each of the pair of fifth NMOS transistors has a third channel having the doping concentration that is approximately the same as the substrate.

8. An apparatus comprising:

a buffering stage that receives an enable signal and an input signal and that provides an output signal, wherein the buffering stage includes:

an input stage having:

a PMOS transistor that receives the enable signal at its gate;

an NMOS transistor that receives the enable signal at its gate; and a voltage divider that is coupled between the PMOS transistor and the NMOS transistor and that receives the input signal;

a buffering substage that includes a buffering transistor that is coupled to the voltage divider, wherein the buffering transistor is formed on a substrate, and wherein the buffering transistor has a channel with a doping concentration that is approximately the same as the substrate; and a current control circuit that is coupled to the buffering substage; and a bandgap stage that is coupled to the current control circuit and that is activated and deactivated by the enable signal.

9. The apparatus of claim 8, wherein the PMOS transistor further comprises a first PMOS transistor, and wherein the NMOS transistor further comprises a first NMOS transistor, and wherein the buffering transistor further comprises a plurality of NMOS buffering transistors, and wherein the buffering substage further comprises a plurality of branches that are in parallel with one another, and wherein each branch includes at least one of the plurality of NMOS buffering transistors, and wherein each branch includes:

a second PMOS transistor that receives the enable signal at its gate and that is coupled to the drain of its NMOS buffering transistor at its drain;

a resistor that is coupled to the source of its NMOS buffering transistor; and a second NMOS transistor that is coupled to the source of its NMOS buffering transistor at its drain.

10. The apparatus of claim 8, wherein the PMOS transistor further comprises a first PMOS transistor, and wherein the buffering transistor is an NMOS buffering transistor, and wherein the buffering substage further comprises:

a second PMOS transistor that receives the enable signal at its gate and that is coupled to the drain of the NMOS buffering transistor at its drain;

a resistor that is coupled to the source of the NMOS buffering transistor; and a second NMOS transistor that is coupled to the source of the NMOS buffering transistor at its drain.

11. The apparatus of claim 10, wherein the resistor further comprises a first resistor, and wherein the bandgap stage further comprises:

a differential amplifier having a first input terminal, a second input terminal, and an output terminal, wherein the first input terminal receives a bandgap voltage;

a third PMOS transistor that is coupled to the output terminal of the differential amplifier at its gate and the second input terminal of the differential amplifier at its drain; and a second resistor that is coupled to the drain of the third PMOS transistor.

12. The apparatus of claim 11, wherein the current control circuit further comprises:

a plurality of current control branches that are coupled in parallel to one another, wherein each current control branch includes:

a fourth PMOS transistor that is coupled to the output terminal of the differential amplifier at its gate; and a fifth PMOS transistor that is coupled to the drain of the third PMOS transistor at its source; and a third NMOS transistor that is coupled to the drain of the fifth PMOS transistor of each current control branch at its drain and gate and that is coupled to the gate of the second NMOS transistor at its gate.

13. The apparatus of claim 12, wherein the channel further comprises a first channel wherein the buffering substage further comprises a fourth NMOS transistor that is coupled between the NMOS buffering transistor and the second NMOS transistor, and wherein the current control circuit further comprises a fifth NMOS transistor that is coupled between the plurality of current control branches and the third NMOS transistor, and wherein the fourth and fifth NMOS transistors each have a second channel having the doping concentration that is approximately the same as the substrate.

14. The apparatus of claim 13, wherein the differential amplifier further comprises:

a differential input pair; and a current mirror that is coupled to the differential input pair.

15. The apparatus of claim 14, wherein the differential amplifier further comprises a pair of sixth NMOS transistors coupled between the differential input pair and the current mirror, and wherein each of the pair of sixth NMOS transistors has a third channel having the doping concentration that is approximately the same as the substrate.

* * * * *